US009424855B2

(12) United States Patent
Qiu et al.

(10) Patent No.: US 9,424,855 B2
(45) Date of Patent: Aug. 23, 2016

(54) AUDIO DEVICE AND METHOD FOR ADDING WATERMARK DATA TO AUDIO SIGNALS

(71) Applicants: Jian-Ming Qiu, Shenzhen (CN); Ya-Hui Zhang, Shenzhen (CN)

(72) Inventors: Jian-Ming Qiu, Shenzhen (CN); Ya-Hui Zhang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 782 days.

(21) Appl. No.: 13/684,572

(22) Filed: Nov. 25, 2012

(65) Prior Publication Data

US 2013/0136275 A1     May 30, 2013

(51) Int. Cl.
*H04B 15/00* (2006.01)
*G10L 19/018* (2013.01)
*H03H 11/12* (2006.01)

(52) U.S. Cl.
CPC ........... *G10L 19/018* (2013.01); *H03H 11/126* (2013.01)

(58) Field of Classification Search
CPC . G10L 19/018; G10L 19/0204; G10L 19/02; H03H 11/126
USPC ................ 381/94.2, 94.3, 123, 73.1, 99, 98; 380/236, 237, 238; 700/94; 713/176
See application file for complete search history.

(56) References Cited

U.S. PATENT DOCUMENTS

| 2003/0172277 | A1* | 9/2003 | Suzuki et al. | ................ 713/176 |
| 2003/0231785 | A1 | 12/2003 | Rhoads et al. | |
| 2006/0052887 | A1* | 3/2006 | Sakaguchi et al. | ............. 700/94 |
| 2011/0135277 | A1* | 6/2011 | Quan | ............................ 386/256 |

FOREIGN PATENT DOCUMENTS

| CN | 101263552 | 9/2008 |
| CN | 101290773 | 10/2008 |
| CN | 101621730 A | 1/2010 |
| CN | 102074237 | 5/2011 |
| TW | I222607 | 10/2004 |
| TW | I332367 | 10/2010 |
| WO | 2007019521 A2 | 2/2007 |

\* cited by examiner

*Primary Examiner* — Vivian Chin
*Assistant Examiner* — Con P Tran
(74) *Attorney, Agent, or Firm* — ScienBiziP, P.C.

(57) ABSTRACT

An audio device comprises a processor, an audio processing module, a high frequency noise generating circuit, a first switch control circuit, a second switch control circuit, a low pass filter circuit and an adder circuit. The audio device generates a watermark data, an original audio signal and a high frequency noise signal. The high frequency noise signal pass through a first switch control circuit and a second switch control circuit according to watermark data. A low pass filter circuit filters the high frequency noise signal received from the first switch control circuit to form a first add data. An adder circuit receives the first add data from the low pass filter circuit, receives the high frequency noise signal from the second switch control circuit as a second add data, and adds the first add data and the second add data to the original audio signal.

8 Claims, 7 Drawing Sheets

AUDIO DEVICE AND METHOD FOR ADDING WATERMARK DATA TO AUDIO SIGNALS

BACKGROUND

1. Technical Field

The disclosure relates to audio devices, and particularly to a method for an audio device to add watermark data to audio signals.

2. Description of Related Art

With the development and comprehensive use of multimedia and digital communications, authenticity and protection of the multimedia such as, audio and video and the security of information is getting more important. Ordinarily, when making an audio disc, for example, the original audio signal is output just after being converted from analog to digital, therefore it is easy to divulge information of the original audio signal and difficult to find out a source of the divulgement. Thus, copyright laws can be broken resulting in loss in commerce.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
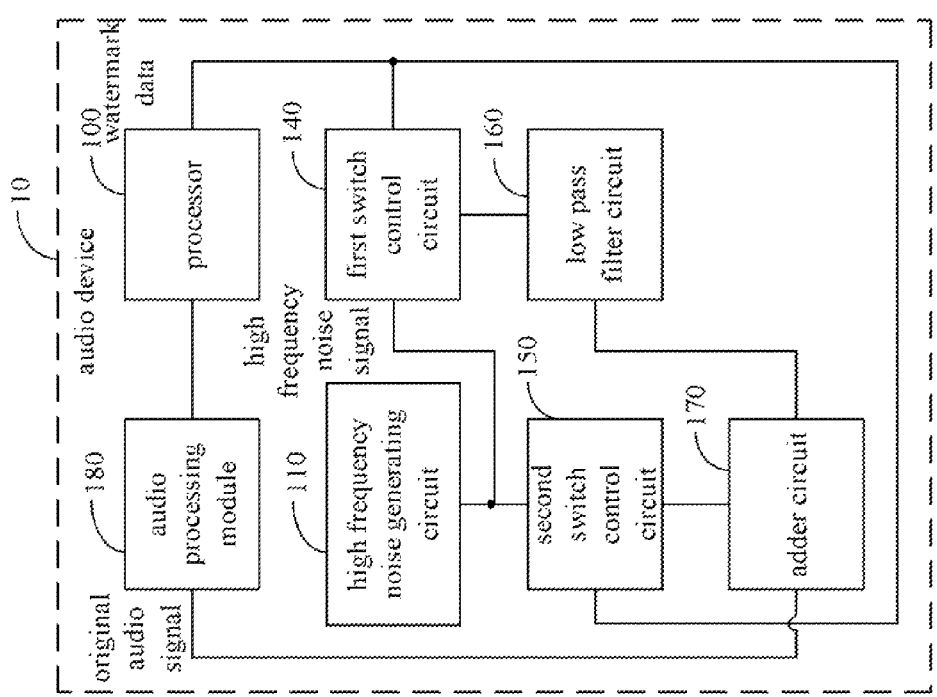
FIG. 1 is a schematic diagram of one embodiment of an audio device as disclosed.

FIG. 1 is a schematic diagram of one embodiment of an audio device 10 as disclosed. In one embodiment, the audio device 10, a set-top box, for example, generates or records audio signals, and adds a watermark data to the audio signals. The watermark data can be used to find out a source of a leak of the audio signals through reverse extraction of the added watermark data.

The audio device 10 comprises a processor 100, an audio processing module 180, a high frequency noise generating circuit 110, a first switch control circuit 140, a second switch control circuit 150, a low pass filter circuit 160, and an adder circuit 170. The processor 100 controls operation of the audio device 10 and generates the watermark data. In one embodiment, the watermark data comprises digital signals comprising high level logic digital signals 1 and low level logic digital signals 0. The watermark data includes digital copyright information, such as hardware serial numbers of the audio device 10, which can be used to find out the source of the leak of the audio signals. The watermark data includes the header information, the digital right information, and last information. For example, when the watermark data comprises 10101010 1111010000101001 01010101, then "10101010" is the header information, "1111010000101001" is the digital right information, and "01010101" is the last information. The audio processing module 180 connects to the processor and generates an original audio signal. The high frequency noise generating circuit 110 generates a high frequency noise signal. In one embodiment, frequency band of the high frequency noise signal which is generated by the high frequency noise generating circuit 110 is above 20 KHz, and the high frequency noise signal generated by the high frequency noise generating circuit 110 will not influence the original audio signal because 20 KHz is beyond scope of human hearing.

The first switch control circuit 140 is connected to the processor 100 and the second switch control circuit 150 is connected to the high frequency noise generating circuit 110, the high frequency noise signal passes through the first switch control circuit 140 and the second switch control circuit 150 according to a different voltage level of the watermark data, the high frequency noise signal passes through the corresponding switch of the first switch control circuit 140 and the second switch control circuit 150. In one embodiment, the high frequency noise signal passes through the first switch control circuit 140 when the watermark data is the high level logic signals 1. The high frequency noise signal passes through the second switch control circuit 150 when the watermark data is the low level logic signals 0. Thus, the high frequency noise signal will not simultaneously pass through both the first switch control circuit 140 and the second switch control circuit 150, but only pass through one of the first switch control circuit 140 and the second switch control circuit 150. In another embodiment, the first switch control circuit 140 controls the high frequency noise signal to pass through the first switch control circuit 140 when the watermark data is the low level logic signals 0, and the second switch control circuit 150 controls the high frequency noise signal to pass through the second switch control circuit 150 when the watermark data is the high level logic signals 1.

Figure 3:
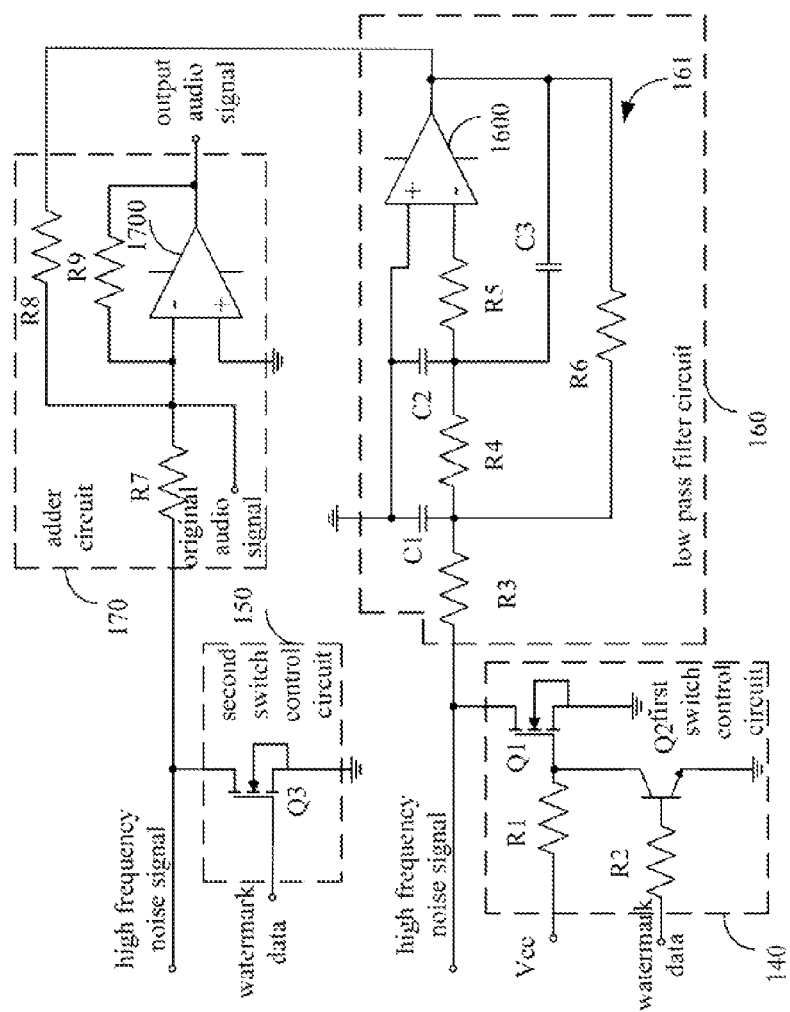
FIG. 3 is a circuit diagram of one embodiment of the audio device as disclosed.
Figure 4:
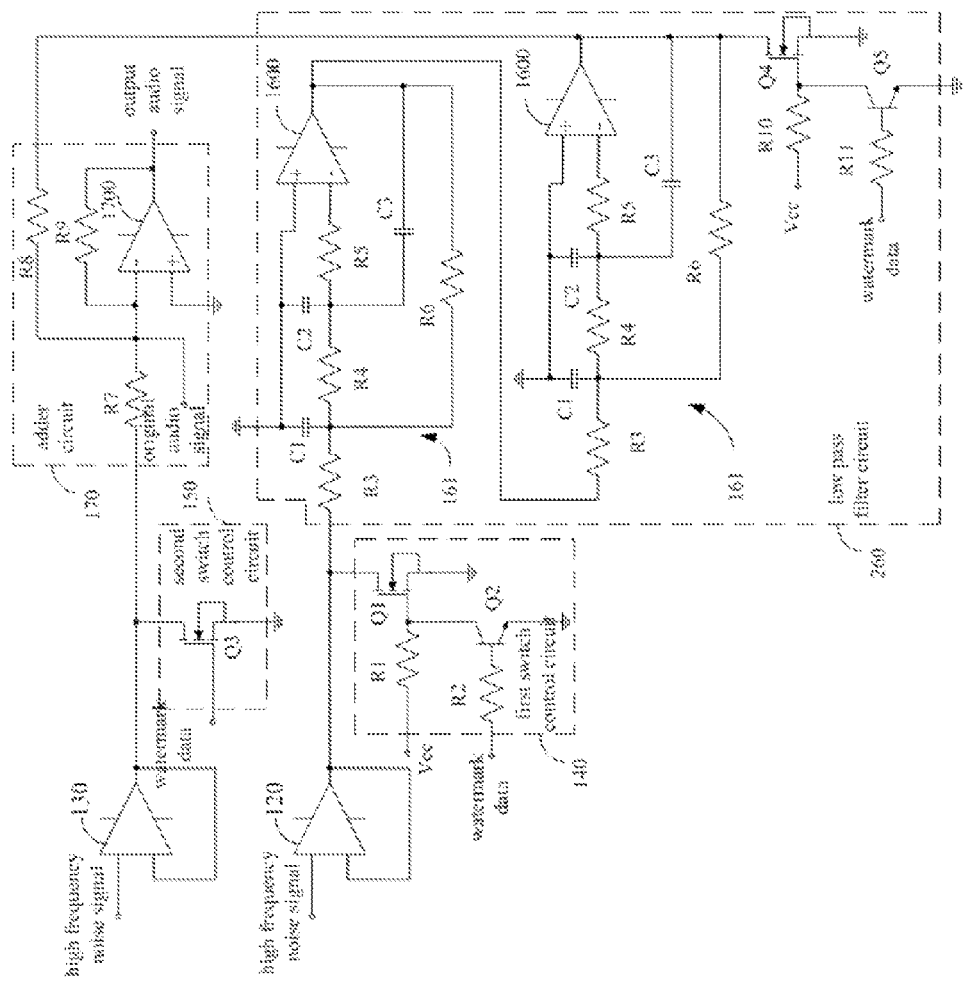
FIG. 4 is a circuit diagram of one embodiment of the audio device as disclosed.

The low pass filter circuit 160 is connected to the first switch control circuit 140, the low pass filter circuit 160 comprises at least a low pass filter unit 161, referring to FIG. 3 and FIG. 4, and the low pass filter unit 161 filter the high frequency noise signal received from the first switch control circuit 140 to form a first added data. In one embodiment, compared to the high frequency noise signal, a voltage amplitude of the first added data is less than a voltage amplitude of the high frequency noise signal because the first added data is the high frequency noise signal that was filtered. In one embodiment, the high frequency noise signal that is output by the second switch control circuit 150 forms a second added data.

The adder circuit 170 receives the first added data from the low pass filter circuit 160, the second added data from the second switch control circuit 150, and the original audio signal from the audio processing module 180. The adder circuit 170 adds the first added data and the second added data to the original audio signal to output an output audio signal to other devices or play.

Figure 6:
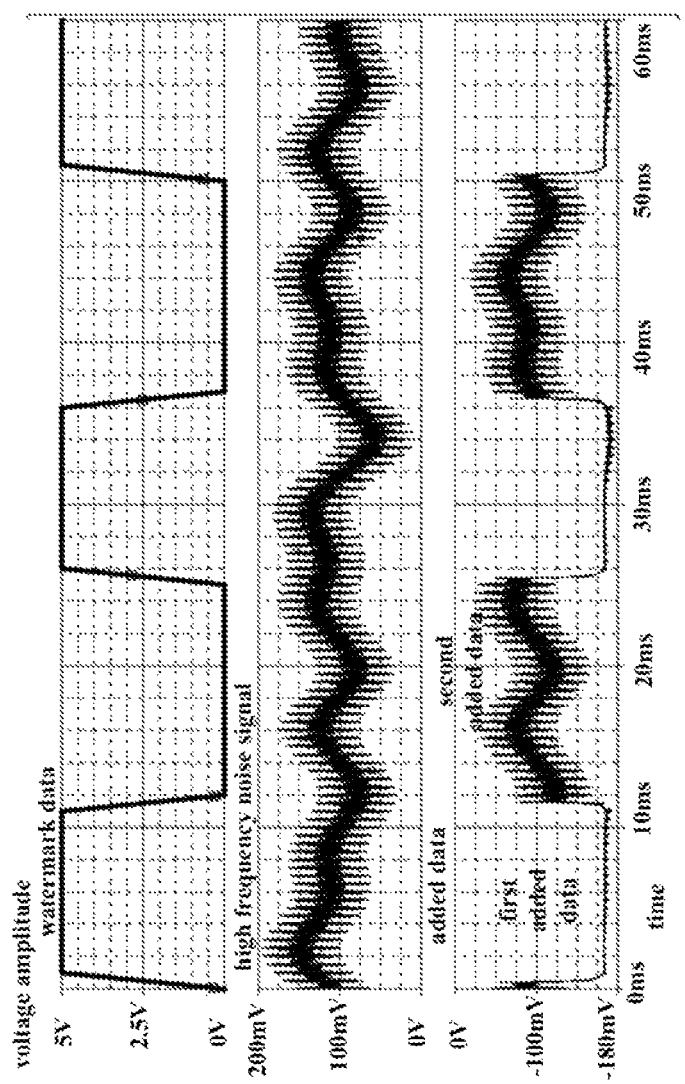
FIG. 6 is a simulation waveform of the watermark data, a high frequency noise signal, a first added data and a second added data as disclosed.

FIG. 6 is a simulation waveform of the watermark data, the high frequency noise signal, the first added data, and the second added data as disclosed. In one embodiment, the watermark data is approximately a square wave with alternating high and low potential. The first added data corresponds to the high voltage level of the watermark data and is the high frequency noise signals that have been filtered by the low pass filter circuit 160. Thus, the voltage amplitude of the first added data is less than that of the high frequency noise signal. The second added data corresponds to the low voltage level of the watermark data and is original high frequency signals. That is, the audio device 10 uses high frequency noise signal with different voltage levels as the watermark data to superpose to the original audio signal. From this point on, the high frequency noise signal will be called a carrier signal. The high frequency noise signal that is added to the original audio signal will not influence the original audio signal because frequency band of the high frequency noise signal is above 20 KHz, accordingly, quality of the original audio is assured.

Figure 2:
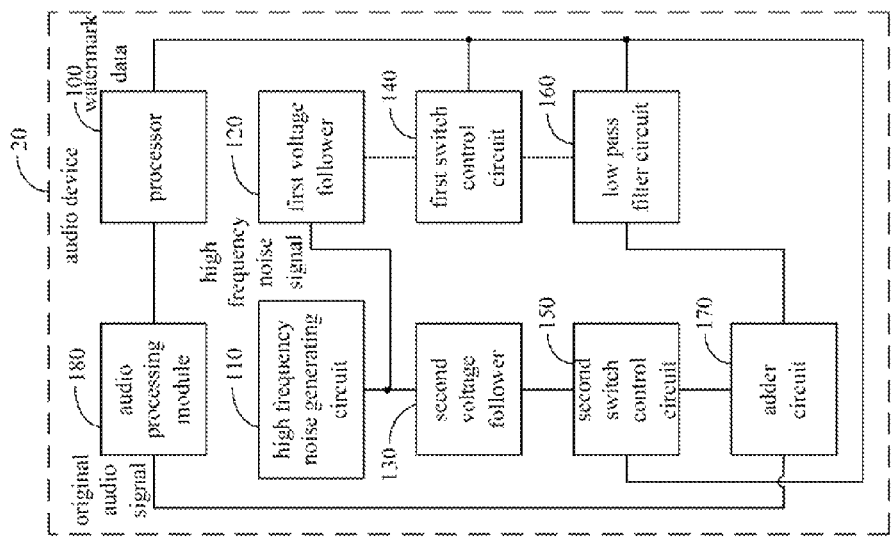
FIG. 2 is a schematic diagram of another embodiment of an audio device as disclosed.

FIG. 2 is a schematic diagram of another embodiment of an audio device 20 as disclosed. In one embodiment, difference between the audio device 20 and the audio device 10 in FIG. 2 is that the audio device 20 further comprises a first voltage follower 120 and a second voltage follower 130 and the low pass filter circuit 160 is further connected to the processor 100 to receive the watermark data. The first voltage follower 120 is connected between the high frequency noise generating circuit 110 and the first switch control circuit 150. Thereby, the signal generated by the first switch control circuit 140 and the second switch control circuit 150 will not return to the high frequency noise generating circuit 110, which avoids affecting the original high frequency noise signal.

FIG. 3 is a circuit diagram of one embodiment of the audio device 10. In one embodiment, the first switch control circuit 140 comprises a first switch unit Q1 and a second switch unit Q2. The first switch unit Q1 and the second switch unit Q2 both comprise a control end, a first electrode, and a second electrode. The control end of the first switch unit Q1 is connected to a reference voltage through a first resistor R1. The first electrode of the first switch unit Q1 is connected to the low pass filter circuit 160 and the high frequency noise generating circuit 110 to receive the high frequency noise signal. The second electrode of the first switch unit Q1 is grounded. The control end of the second switch unit Q2 receives the watermark data from the processor 100 through a second resistor R2. The first electrode of the second switch unit Q2 is connected to the control end of the first switch unit Q1 and the second electrode of the second switch unit Q2 is grounded. In one embodiment, the first switch unit Q1 may be a N-type Metal-Oxide-Semiconductor Field-Effect Transistor (MOSFET). The control end of the first switch unit Q1 may be a gate of the NMOS, the first electrode of the first switch unit Q1 may be a drain of the NMOS, and the second electrode of the first switch unit Q1 may be a source of the NMOS. The second switch unit Q2 may be a npn bipolar transistor. The control end of the second switch unit Q2 may be a base of the npn bipolar transistor. The first electrode of the second switch unit Q2 may be a collector of the npn bipolar transistor, and the second electrode of the second switch unit Q2 may be an emitter of the npn bipolar transistor.

The second switch control circuit 150 comprises a third switch unit Q3 comprising a control end, a first electrode, and a second electrode. The control end of the third switch unit Q3 is connected to the processor 100 that receives the watermark data. The first electrode of the third switch unit Q3 connected to the adding circuit 170 and the high frequency noise generating circuit 110 and the second electrode of the third switch unit Q3 are connected to ground. In one embodiment, the third switch unit Q3 may be an NMOS. The control end of the third switch unit Q3 may be a gate of the NMOS. The first electrode of the third switch unit Q3 may be a drain of the NMOS, and the second electrode of the third switch unit Q3 may be a source of the NMOS.

The low pass filter circuit 160 comprises a low pass filter unit 161. In one embodiment, the low pass filter unit 161 comprises a third resistor R3, a fourth resistor R4, a fifth resistor R5, a sixth resistor R6, a first capacitor C1, a second capacitor C2, a third capacitor C3, and a first comparator 1600. A first end of the third resistor R3 is connected to the first electrode of the first switch unit Q1 of the first switch control circuit 140 to receive the high frequency noise signal, and a second end of the third resistor R3 is grounded through the first capacitor C1. A first end of the fourth resistor R4 is connected to the second end of the third resistor R3, and a second end of the fourth resistor R4 is grounded through the second capacitor C2. The first comparator 1600 having a positive input end connected to ground, a negative input end connected to the second end of the fourth resistor R4 through the fifth resistor R5. In addition, an output end that is connected to the second end of the fourth resistor R4 through the third capacitor C3 and the second end of the third resistor R3 through the sixth resistor R6 outputs the first added data.

The adder circuit 170 comprises an inverting adder 1700. A negative input end of the inverting adder 1700 is connected to the first electrode of the third switch unit Q3 of the second switch control circuit 150 through a seventh resistor R7, the output end of the first comparator 1600 through a eighth resistor R8, and receives the original audio signal from the audio processing module 180. An output end of the inverting adder 1700 outputs the audio signals. In one embodiment, a positive input of the inverting adder 1700 is grounded, and the output end of the inverting adder 1700 is connected to the negative input of the inverting adder 1700 through a ninth resistor R9.

At a first moment, such as the time 0-12 ms in FIG. 6, when the watermark data is the high level logic signals, the second switch unit Q2 of the first switch control circuit 140 is switched, an electric potential of the control end of the first switch unit Q1 decreases, the first switch unit Q1 turns off. Thereby, the high frequency noise signal is output to the low pass filter circuit 160 by the high frequency noise generating circuit 110. The low pass filter circuit 160 filters the high frequency noise signal to form the first added data whose voltage amplitude decreases. In addition, transmits the first added data to the adder circuit 170 through the eighth resistor R8. All together, the third switch unit Q3 of the second switch control circuit 150 is switched, an electric potential of the first electrode of the third switch unit Q3 decreases, and the carrier signal cannot enter the adder circuit 170. At that moment, the added data only is the first added data, and the adder circuit 170 adds the first added data to the original audio signal.

Figure 7:
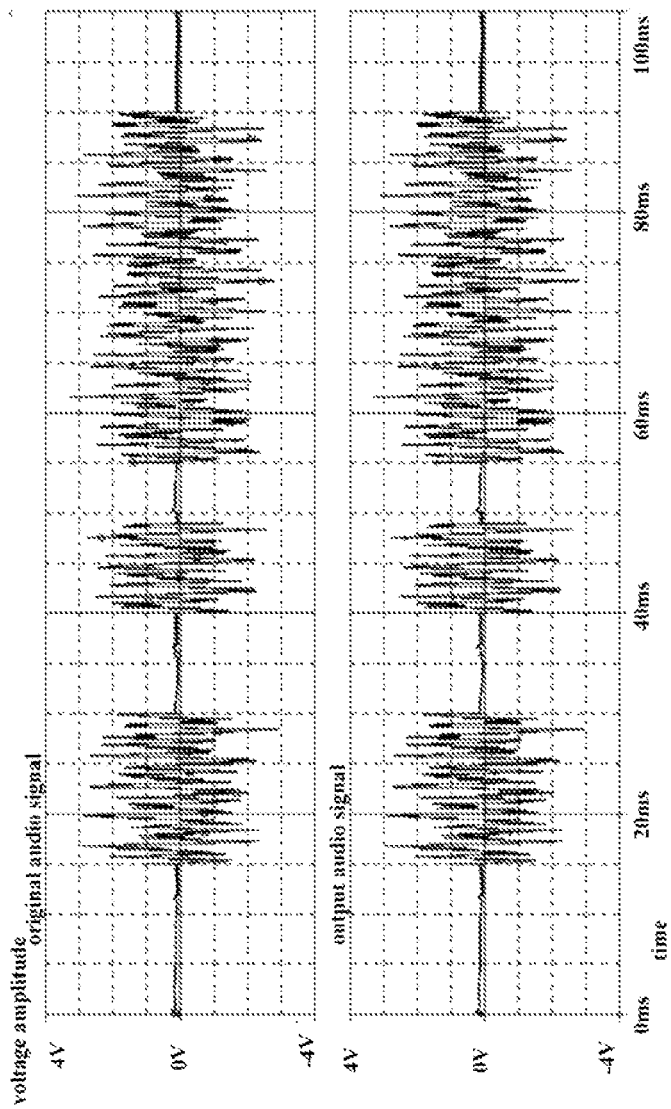
FIG. 7 is a simulation waveform of an original audio signal and an output audio signal as disclosed.

Next, at such a time as 12-25 ms as shown in FIG. 6, when the watermark data is the matching low logic signal, the second switch unit Q2 turns off. The first switch unit Q1 is switched, the electric potential of the first electrode of the first switch unit Q1 decreases, and the carrier signal cannot enter the low pass filter circuit 160. The low pass filter circuit 160 has no output data for the adder circuit 170. Simultaneously, the third switch unit Q3 of the second switch control circuit 150 turns off, the high frequency noise signal is transmitted to the adder circuit 170 through high frequency noise generating circuit 110. At that moment, the added data only is the second added data. The adder circuit 170 adds the second added data to the original audio signal. In this analogy, the audio device 10 generates the different voltage levels of the high frequency noise signals as the watermark data to superpose to the original audio signal. The quality of the output audio signal is assured. FIG. 7 is a simulation waveform of the original audio signal and the output audio signal. It can be seen from the figure that the waveform of the original audio signal and the output audio signal are almost the same, it indicates that the high frequency noise signal that is added to the original audio signal will not influence the original audio signal, the quality of the output audio signal is assured.

FIG. 4 is a circuit diagram of one embodiment of the audio device 20. In one embodiment, differences between the audio device 20 and the audio device 10 in FIG. 3 are the circuit of the first voltage follower 120, the second voltage follower 130, and the low pass filter circuit 160. The first voltage follower 120 is connected between the high frequency noise generating circuit 110 and the first electrode of the first switch unit Q1 of the first switch control circuit 140. The first voltage follower 120 is connected between the high frequency noise generating circuit 110 and the first electrode of the first switch unit Q1 of the first switch control circuit 140. The second voltage follower 130 is connected between the high frequency noise generating circuit 110 and the first electrode of the third switch unit Q3 of the second switch control circuit 150.

In one embodiment, the low pass filter circuit 160 comprises two low pass filter units 161 which are connected in series between the first switch control circuit 140 and the adder circuit 170. The low pass filter circuit 160 further comprises a fourth switch unit Q4 and a fifth switch unit Q5. The fourth switch unit Q4 and the fifth switch unit Q5 both comprise a control end, a first electrode, and a second electrode. The control end of the fourth switch unit Q4 is connected to a reference voltage through a tenth resistor R10. The first electrode of the fourth switch unit Q4 is connected to the output end of the low pass filter circuit 160, which is the output end of the first comparator 1600 of the another low pass filter unit 161. The second electrode of the fourth switch unit Q4 connected to ground. The control end of the fifth switch unit Q5 receives the watermark data through an eleventh resistor R11. The first electrode of the fifth switch unit Q5 connected to the control end of the fourth switch unit Q4, and the second electrode of the fifth switch unit Q5 is connected to ground.

In one embodiment, the fourth switch unit Q4 may be an NMOS. The control end of the fourth switch unit Q4 may be a gate of the NMOS. The first electrode of the fourth switch unit Q4 may be a drain of the NMOS, and the second electrode of the fourth switch unit Q4 may be the source of the NMOS. The fifth switch unit Q5 may be a npn bipolar transistor. The control end of the fifth switch unit Q5 may be a base of the npn bipolar transistor. The first electrode of the fifth switch unit Q5 may be a collector of the npn bipolar transistor, and the second electrode of the fifth switch unit Q5 may be a the emitter of the npn bipolar transistor.

At first such as the time 0-12 ms as shown in FIG. 6, when the watermark data is the high level logic signals. The second switch unit Q2 of the first switch control circuit 140 is switched, an electric potential of the control end of the first switch unit Q1 decreases, and accordingly the first switch unit Q1 turns off. Thereby, the high frequency noise signal is output to the low pass filter circuit 160 by the high frequency noise generating circuit 110. The low pass filter circuit 160 filters the high frequency noise signal by the two low pass filter units 161 to form the first added data whose voltage amplitude decreases. At that moment, the fifth switch unit Q5 of the low pass filter circuit 160 is switched, an electric potential of the control end of the fourth switch unit Q4 decreases, and the fourth switch unit Q4 is turned off. Thereby, the first added data is transmitted to the adder circuit 170 through the eighth resistor R8. Simultaneously, the third switch unit Q3 of the second switch control circuit 150 is switched, electric potential of the first electrode of the third switch unit Q3 decreases, and the carrier signal cannot enter to the adder circuit 170. The added data is the first added data, the adder circuit 170 adds the first added data to the original audio signal.

Next, at such a time as 12-25 ms in FIG. 6, when the watermark data is the matching low logic signal, the second switch unit Q2 turns off, the first switch unit Q1 is switched, the electric potential of the first electrode of the first switch unit Q1 decreases, and accordingly the high frequency noise signal cannot enter to the low pass filter circuit 160. At that moment, the fifth switch unit Q5 of the low pass filter circuit 160 turns off, the fourth switch unit Q4 is switched. In addition, the potential of the output end of the low pass filter circuit 160 decreases, assuring that the low pass filter circuit 160 has no data to output. Further, the added data superposed by the adder circuit 170 is completely corresponding to the watermark data. Thereby, the low pass filter circuit 160 has no output data for the adder circuit 170. Simultaneously, the third switch unit Q3 of the second switch control circuit 150 turns off, the high frequency noise signal is transmitted to the adder circuit 170 through high frequency noise generating circuit 110. At this moment, the added data only is the second added data, the adder circuit 170 adds the second added data to the original audio signal. In this analogy, the audio device 10 generates the different voltage levels of the high frequency noise signal as the watermark data to superpose to the original audio signal, assuring the quality of the output audio signal.

Figure 5:
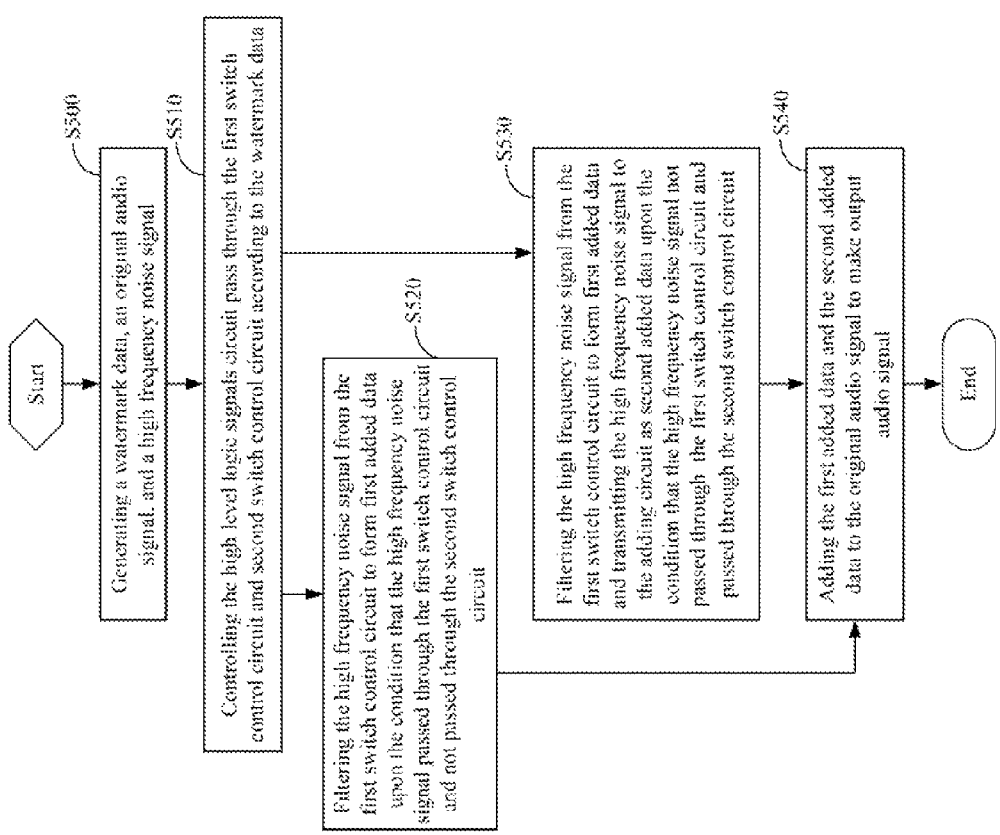
FIG. 5 is a flowchart of one embodiment of a watermark data of an audio signals adding method.

FIG. 5 is a flowchart of one embodiment of the watermark data of the audio signals adding method. The flowchart is executed by the modules of the audio device 10 of FIG. 1. Depending on the embodiment, additional blocks may be added, others deleted, and the ordering of blocks may be changed while remaining well within the scope of the disclosure.

In block S500, the audio processing module 180 generates the original audio signal, the processor 100 generates the watermark data, and the high frequency noise generating circuit 110 generates the high frequency noise signal. In the embodiment, frequency band of the high frequency noise signal is above 20 KHz, the watermark data is the signal that comprises the high level logic digital signal and the low level logic digital signal. Into block S500, the high frequency noise signal pass through the first switch control circuit 140 and the second switch control circuit 150 according to the different voltage levels of the watermark data. In the embodiment, the first switch control circuit 140 controls the high frequency noise signal to pass through the first switch control circuit 140 when the watermark data is the high level logic signals, the high frequency noise signal enter to the low pass filter circuit 160. The second switch control circuit 150 controls the high frequency noise signal to pass through the second switch control circuit 150 when the watermark data is the low level logic signals, the high frequency noise signal enter to the adder circuit 170.

In block S520, when the first switch control circuit 140 controls the high frequency noise signal to pass through the first switch control circuit 140 and the second switch control circuit 150 controls the high frequency noise signal to be blocked, the low pass filter circuit 160 filter the high frequency noise signal received to form the first added data. The first added data is the high frequency noise signals that have been filtered by the low pass filter circuit 160, and voltage amplitude of the first added data decreases to replace the high potential watermark data.

Into block S530, when the first switch control circuit 140 controls the high frequency noise signal to be blocked and the second switch control circuit 150 control the high frequency noise signal to pass through the second switch control circuit 150, the first switch control circuit 150 transmit the high frequency noise signal to the adding circuit 170 as second added data. In one embodiment, the second added data is the original audio signal, correspond to the low potential watermark data.

Into the block S540, the adding circuit 170 adds the first added data and the second added data into the original audio signal to make output audio signal.

The audio device 10 and the audio device 20 and the method for adding watermark data to audio signals in the present disclosure converts the watermark data of the high level logic signals and low level logic signals to different voltage levels of the high frequency noise signal, and add it to the original audio signal, which can find out the source of the leak through reverse extracting of the added watermark data when the divulgement happened, accordingly, quality of the original audio is assured. Moreover, the watermark data is converted to the high frequency noise signal and will not influence the original audio signal, accordingly, quality of the output audio signal is assured.

The foregoing disclosure of the various embodiments has been presented for purposes of illustration and description. It is not intended to be exhaustive or to limit the present disclosure to the precise forms disclosed. Many variations and modifications of the embodiments described herein will be apparent to one of ordinary skill in the art in the light of the above disclosure. The scope of the present disclosure is to be defined only by the claims appended hereto and their equivalents.

What is claimed is:

1. An audio device, comprising:
a processor that generates a watermark data, the watermark data comprising high level logic signals and low level logic signals;
an audio processing module connected to the processor, wherein the audio processing module generates an original audio signal;
a high frequency noise generating circuit that generates a high frequency noise signal;
a first switch control circuit connected to the processor and the high frequency noise generating circuit;
a second switch control circuit connected to the processor and the high frequency noise generating circuit, wherein the high frequency noise signal passes through one of the first switch control circuit and the second switch control circuit when the watermark data is the high level logic signals, and the high frequency noise signal passes through the other one of the first switch control circuit and the second switch control circuit when the watermark data is the low level logic signals;
a low pass filter circuit connected to the first switch control circuit, wherein the low pass filter circuit filters the high frequency noise signal received from the first switch control circuit to form a first add data; and
an adder circuit that receives the first add data from the low pass filter circuit, receives the high frequency noise signal from the second switch control circuit as a second add data, and adds the first add data and the second add data to the original audio signal.

2. The audio device of claim 1, further comprising:
a first voltage follower connected between the high frequency noise generating circuit and the first switch control circuit, wherein the first voltage follower separates the high frequency noise generating circuit from the first switch control circuit; and
a second voltage follower connected between the high frequency noise generating circuit and the second switch control circuit, wherein the second voltage follower isolates the high frequency noise generating circuit from the second switch control circuit.

3. The audio device of claim 1, wherein the first switch control circuit comprises:
a first switch unit comprising a control end connected to a reference voltage through a first resistor, a first electrode connected to the low pass filter circuit and a second electrode connected to ground, wherein the first electrode receives the high frequency noise signal; and
a second switch unit comprising a control end that receives the watermark data through a second resistor, a first electrode connected to the control end of the first switch unit, and a second electrode connected to ground.

4. The audio device of claim 1, wherein the second switch control circuit comprises a third switch unit comprising a control end that receives the watermark data, a first electrode connected to the adder circuit and a second electrode connected to ground, wherein the first electrode receives the high frequency noise signal.

5. The audio device of claim 1, wherein the low pass filter circuit comprises at least a low pass filter unit comprising:
a third resistor having a first end connected to the first switch control circuit;
a first capacitor having a first end connected to a second end of the third resistor, a second end of the first capacitor connected to ground;
a fourth resistor having a first end connected to the second end of the third resistor;
a second capacitor having a first end connected to a second end of the fourth resistor, a second end of the second capacitor connected to ground;
a fifth resistor having a first end connected to the second end of the fourth resistor;
a first comparator having a positive input end connected to ground, a negative input end connected to a second end of the fifth resistor, and an output end outputting the first add data;
a third capacitor connected between the output end of the first comparator and the second end of the fourth resistor; and
a sixth resistor connected between the output end of the first comparator and the second end of the third resistor.

6. The audio device of claim 5, wherein the low pass filter circuit further comprising:
a fourth switch unit comprising a control end connected to a reference voltage through a seventh resistor, a first electrode connected to the output end of the first comparator and the adder circuit, and a second electrode connected to ground;

a fifth switch unit comprising a control end that receives the watermark data through a eighth resistor, a first electrode connected to the control end of the fourth switch unit, and a second electrode connected to ground.

7. The audio device of claim 1, wherein the adder circuit comprises an inverting adder having a negative input end that receives the second add data through a ninth resistor, the first add data through an eight resistor, the first add data through a tenth resistor, and the original audio signal.

8. A method for adding watermark data to audio signals comprising:

generating the watermark data, an original audio signal, and a high frequency noise signal, wherein the watermark data includes high level logic signals and low level logic signals;

controlling the high frequency noise signal to pass through one of a first switch control circuit and a second switch control circuit when the watermark data is the high level logic signals, and controlling the high frequency noise signal to pass through the other one of the first switch control circuit and the second switch control circuit when the watermark data is the low level logic signals;

filtering the high frequency noise signal from the first switch control circuit to form first add data upon the condition that the high frequency noise signal passed through the first switch control circuit and not passed through the second switch control circuit;

transmitting the high frequency noise signal to an adder circuit as second add data upon the condition that the high frequency noise signal does not pass through the first switch control circuit and passes through the second switch control circuit; and adding the first add data and the second add data to the original audio signal to make an output audio signal.

* * * * *